United States Patent
Bovio et al.

[19]

[11] Patent Number: 6,125,034
[45] Date of Patent: Sep. 26, 2000

[54] COMPUTER HAVING INTERNALLY MOUNTED PERIPHERAL DEVICES WITH MOVEABLE ADAPTER

[75] Inventors: Michele Bovio, Boston, Mass.; Mark Foster, Palo Alto, Calif.; Robert C. Frame, Westboro, Mass.; John H. Mallard, Saratoga, Calif.

[73] Assignee: Digital Equipment Corporation, Maynard, Mass.

[21] Appl. No.: 08/822,972

[22] Filed: Mar. 21, 1997

[51] Int. Cl.⁷ .................................. G06F 1/16; H05K 7/02
[52] U.S. Cl. .......................................... 361/686; 439/928.1
[58] Field of Search ..................... 364/708.1; 361/684, 361/686, 737, 749; 174/254; 439/67, 77, 945, 928, 928.1

[56] References Cited

U.S. PATENT DOCUMENTS

| | | | |
|---|---|---|---|
| 5,408,386 | 4/1995 | Ringer et al. | 361/785 |
| 5,426,564 | 6/1995 | Hsu | 361/707 |
| 5,440,449 | 8/1995 | Scheer | 361/686 |
| 5,445,525 | 8/1995 | Broadbent et al. | 439/64 |
| 5,509,811 | 4/1996 | Homic | 439/928.1 |
| 5,517,387 | 5/1996 | Smith | 361/686 |
| 5,542,077 | 7/1996 | Johnson et al. | 395/750 |
| 5,555,487 | 9/1996 | Katoh et al. | 361/680 |
| 5,559,672 | 9/1996 | Buras, Jr. et al. | 361/684 |
| 5,560,022 | 9/1996 | Dunstan et al. | 395/750 |
| 5,564,055 | 10/1996 | Asnaashari et al. | 395/800 |
| 5,619,660 | 4/1997 | Scheer et al. | 361/737 X |
| 5,642,259 | 6/1997 | Ma | 361/686 |
| 5,649,224 | 7/1997 | Scheer | 361/684 X |

*Primary Examiner*—Lynn D. Feild
*Attorney, Agent, or Firm*—Conley, Rose & Tayon, P.C.; Michael F. Heim; Jonathan M. Harris

[57] ABSTRACT

A computer having a case has a connection point for a communications line, where the connection point is accessible from outside the case. A socket receives a standard communications hardware card, the hardware card having a first receptacle to electrically connect to circuits of the computer, and the hardware card having a second receptacle to electrically connect to an exterior electrical circuit, the exterior electrical circuit usually being exterior to the case. A mounting means attaches the socket to the computer, the mounting means positioning the socket to facilitate a connection to the second receptacle of the hardware card, the connection located wholly internal to the case. A multi wire connector electrically connects to the second receptacle of the hardware card, and the multi wire connector is located wholly internal to the case. At least one signal wire has a first end electrically connected to the multi wire connector, and the at least one signal wire has a second end electrically connected to the connection point, the at least one signal wire is located wholly internal to the case, and the at least one signal wire transfers communication signals between the connection point and the hardware card in order to connect the computer to the communications line. The multi wire connector which electrically connects to the second receptacle of the hardware card and is located wholly internally to the case may be located adjacent to an opening in the case, and the opening facilitates inserting the card into the socket. A cover is provided for the opening, the cover closes the case during normal operation of the computer, the cover is removed from the opening for the purpose of removing or inserting the card in the socket.

18 Claims, 12 Drawing Sheets

Fig. 13A

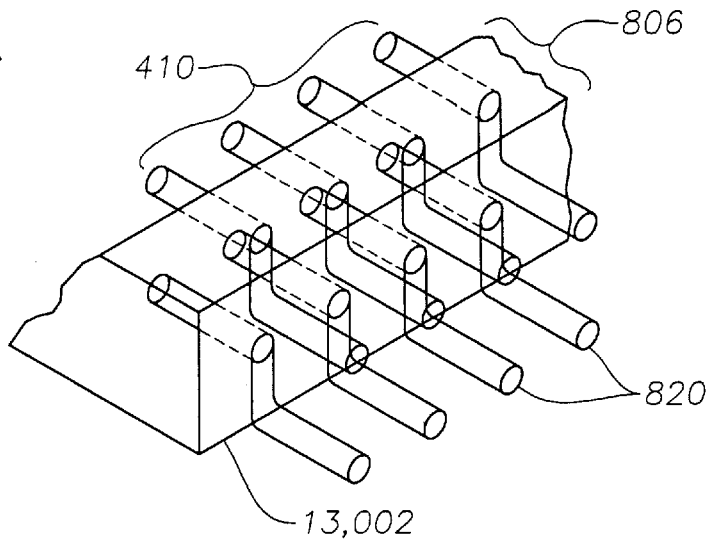

Fig. 13B

| | | | |
|---|---|---|---|
| Ground | 35 | 1 | Ground |
| CD1# | 36 | 2 | Data 3 |
| Data 11 | 37 | 3 | Data 4 |
| Data 12 | 38 | 4 | Data 5 |
| Data 13 | 39 | 5 | Data 6 |
| Data 14 | 40 | 6 | Data 7 |
| Data 15 | 41 | 7 | CE1# |
| CE2# | 42 | 8 | Address 10 |
| VS1#/Refresh | 43 | 9 | OE# (TC) |
| IORD# | 44 | 10 | Address 11 |
| IOWR# | 45 | 11 | Address 9 |
| Address 17 | 46 | 12 | Address 8 |
| Address 18 | 47 | 13 | Address 13 |
| Address 19 | 48 | 14 | Address 14 |
| Address 20 | 49 | 15 | WE# (TC) |
| Address 21 | 50 | 16 | IREQ# |
| Vcc | 51 | 17 | Vcc |
| Vpp2 | 52 | 18 | Vpp1 |
| Address 22 | 53 | 19 | Address 16 |
| Address 23 | 54 | 20 | Address 15 |
| Address 24 | 55 | 21 | Address 12 |
| Address 25 | 56 | 22 | Address 7 |
| VS2#/Rsrvd | 57 | 23 | Address 6 |
| RESET | 58 | 24 | Address 5 |
| WAIT# | 59 | 25 | Address 4 |
| DREQ#/INPACK# | 60 | 26 | Address 3 |
| DACK/REG# | 61 | 27 | Address 2 |
| DREQ#/SPKR# | 62 | 28 | Address 1 |
| STSCHG# | 63 | 29 | Address 0 |
| Data 8 | 64 | 30 | Data 0 |
| Data 9 | 65 | 31 | Data 1 |
| Data 10 | 66 | 32 | Data 2 |
| CD2# | 67 | 33 | DREQ#/IOIS16# |
| Ground | 68 | 34 | Ground |

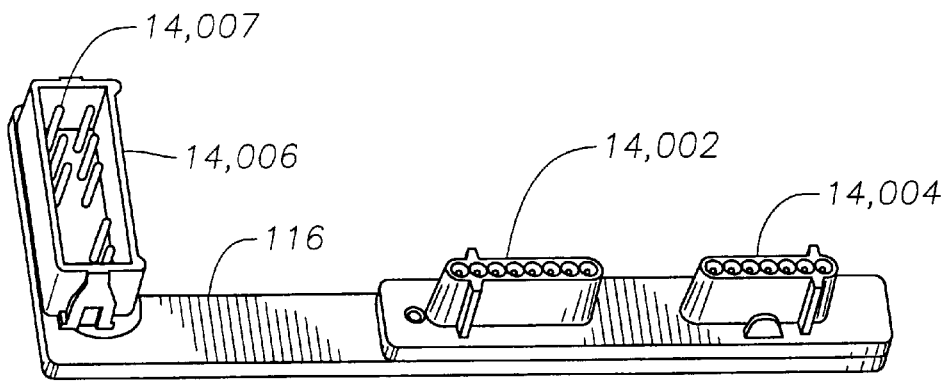
Fig. 14A
Fig. 14B
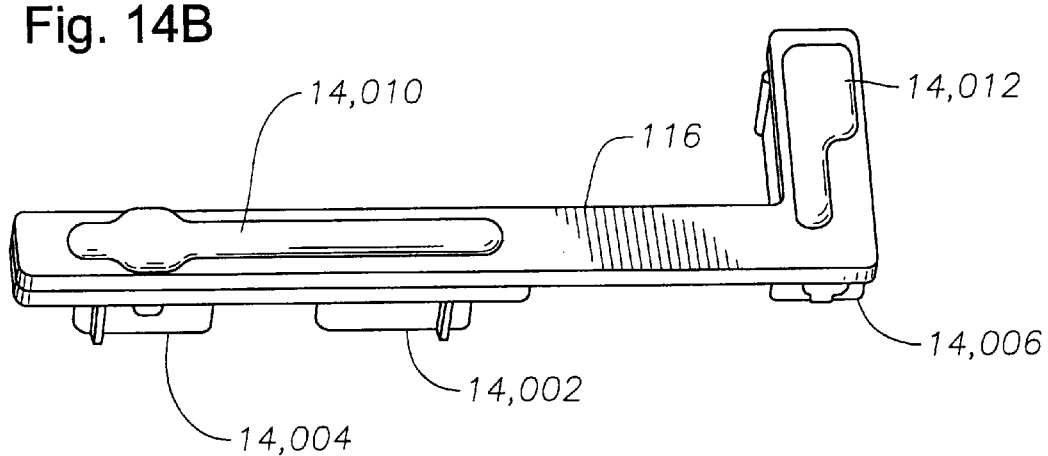
Fig. 14C
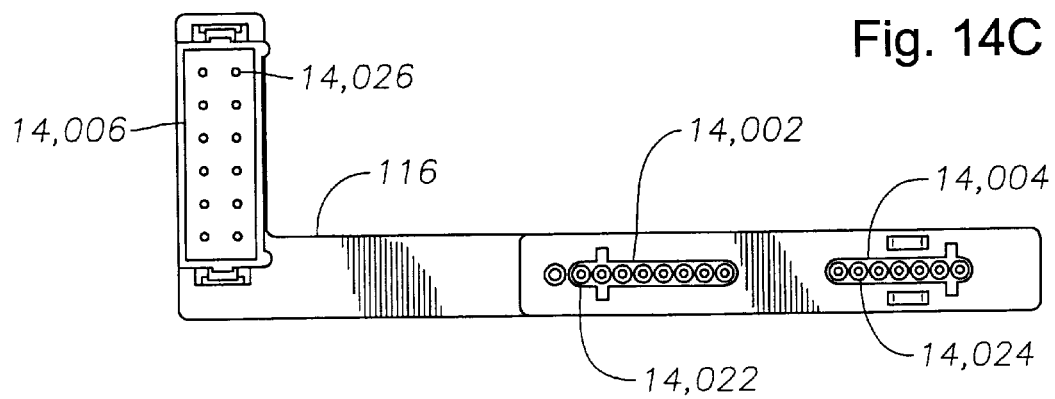

COMPUTER HAVING INTERNALLY MOUNTED PERIPHERAL DEVICES WITH MOVEABLE ADAPTER

FIELD OF THE INVENTION

This invention relates generally to mounting devices within the case of a computer, and more particularly to connection of the devices to external communication lines.

BACKGROUND

Often it is desirable to mount a device within the case of a computer. When the space within the case is severely limited, as it is in a laptop type computer, details of mounting the device become critical. The details of mounting the device are especially critical when the device has ports for connection to external electrical circuits such as communication lines.

Many standard devices for connecting a computer to communications lines are available on the marketplace. Also, new versions of the standard devices are produced with short development times. Accordingly, it is desirable to be able to update the device mounted within a computer to a different type of device, for example a modem to an Ethernet connection, and also to be able to change the device as new and better models are placed on the marketplace by device vendors.

For example, a PCMCIA card is a type of device for which a convenient mounting within a computer is desirable. PCMCIA is an acronym which stands for Personal Computer Memory Card International Association. PCMCIA architecture is disclosed further in the book "PCMCIA System Architecture" second edition, author Don Anderson, published by MindShare, Inc., and Addison Wesley, in 1995, all disclosures of which are incorporated herein by reference.

Also, it is desirable that the computer be easy for a user to connect to the external communications lines. Various methods of connection to external communications lines have been proposed.

However, there remains an unsolved need to easily connect a standard type of communication device to external communication lines in a manner that makes the computer easy to use, while also making it easy for the device to be changed when the user desires to change the nature of the device, or to update the device to a newer model.

SUMMARY OF THE INVENTION

A computer having a case has a connection point for a communications line, where the connection point is accessible from outside the case. A socket receives a standard communications hardware card, the hardware card having a first receptacle to electrically connect to circuits of the computer, and the hardware card having a second receptacle to electrically connect to an exterior electrical circuit, the exterior electrical circuit usually being exterior to the case. A mounting means attaches the socket to the computer, the mounting means positioning the socket to permit a connection to the second receptacle of the hardware card, the connection located wholly internal to the case. A multi wire connector electrically connects to the second receptacle of the hardware card, and the multi wire connector is located wholly internal to the case. At least one signal wire has a first end electrically connected to the multi wire connector, and the at least one signal wire has a second end electrically connected to the connection point, the at least one signal wire is located wholly internal to the case, and the at least one signal wire transfers communication signals between the connection point and the hardware card in order to connect the computer to the communications line.

The multi wire connector which electrically connects to the second receptacle of the hardware card and is located wholly internally to the case may be located adjacent to an opening in the case, and the opening facilitates inserting the card into the socket. A cover is provided for the opening, the cover closes the case during normal operation of the computer, the cover is removed from the opening for the purpose of removing or inserting the card in the socket.

The communications line may be a telephone circuit. The communications line may be a link to a local area network. The communications line may be an Ethernet local area network connection. The hardware card may be a PCMCIA standard card. The computer may be a laptop type computer. The signal wire and the multi wire connector may be made as a single unit, for example they may be a single molded part.

Other and further aspects of the present invention will become apparent during the course of the following description and by reference to the accompanying drawings.

BRIEF DESCRIPTION OF THE DRAWINGS

Referring now to the drawings, in which like numerals represent like parts in the several views:

FIG. 13A is a detail view of a connector.

FIG. 13B is a connection diagram for inner pins of a device card.

FIGS. 14A, 14B, 14C are views of an adapter.

DETAILED DESCRIPTION

Figure 1:
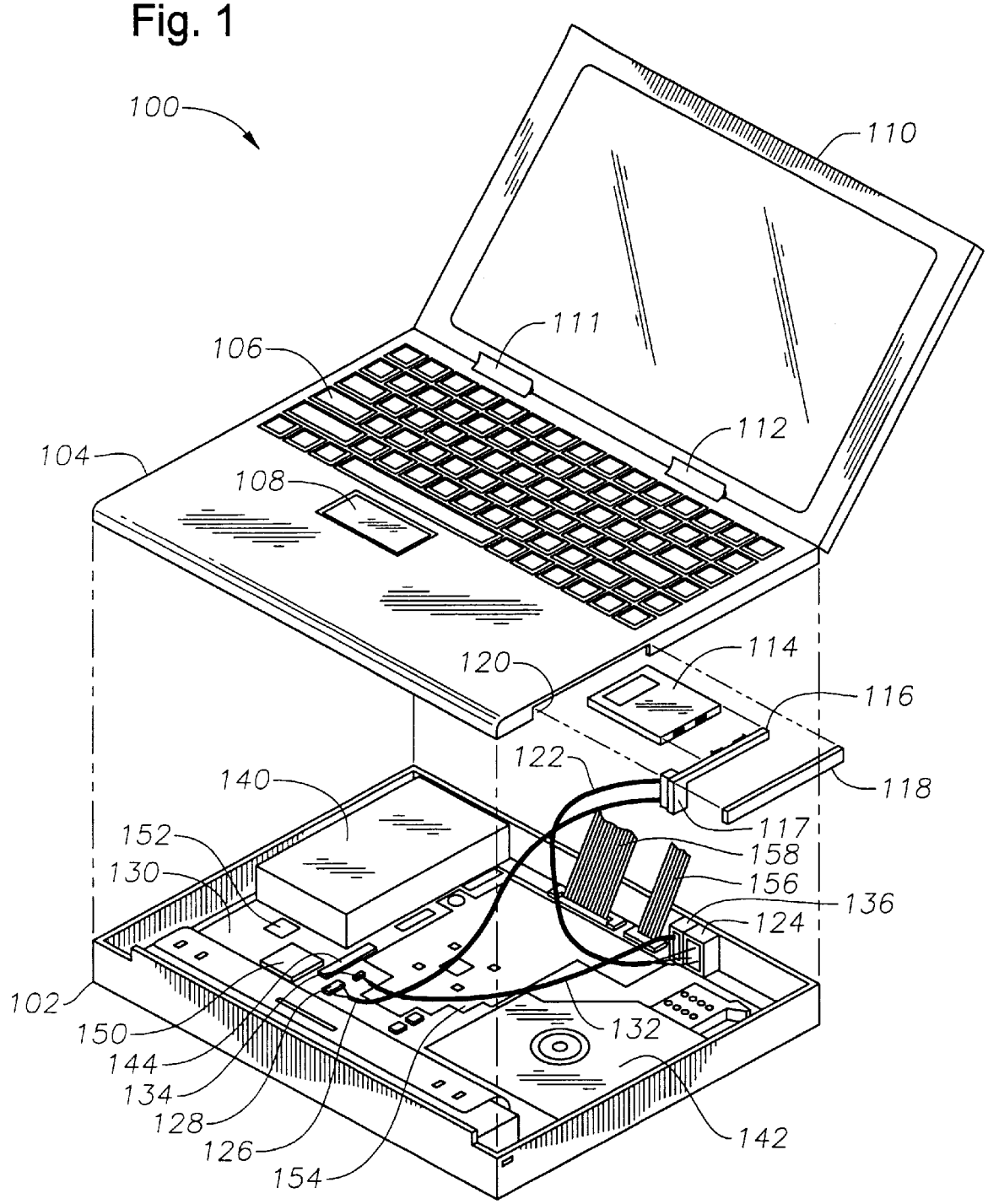
FIG. 1 is an isometric assembly view of a computer within a case.

Turning now to FIG. 1, there is shown computer 100. Computer 100 has a lower shroud 102, and an upper shroud 104. Upper shroud 104 contains a keyboard 106, and a pointing controller 108. Screen 110 is attached by hinges 111 and 112 to upper shroud 104.

Device card 114 is mounted in a socket (not shown in FIG. 1), where the socket is mounted on the underside of upper shroud 104. Adapter 116 has electrical connections into device card 114. Also device card 114 connects into internal parts of computer 100 through a ribbon cable, as will be more fully disclosed hereinbelow. Opening 120 permits device card 114 to be replaceably inserted into the socket (not shown in FIG. 1). Cover 118 closes opening 120 during normal operation of the computer, and during normal operation of device card 114.

Socket 117 of adapter 116 connects to signal cables which connect to device card 114.

Adapter 116 attaches to a first end of telephone signal cable 122 at socket 117, and a second end of telephone signal table 122 attaches to telephone jack 124. An external telephone circuit (not shown) may be plugged into telephone jack 124.

Adapter 116 also attaches to a first end of LAN signal cable 126 at socket 117, and a second end of LAN signal cable 126 attaches, through plug 128, to circuit board 130. A second LAN signal cable 132 attaches through plug 134 to LAN jack 136. LAN jack 136 may, for example, be an Ethernet connection, and a twisted pair Ethernet connection may conveniently plug into LAN jack 136.

Computer 100 contains a hard magnetic disk drive 140. Also, computer 100 contains an optical disc drive 142, for example a CD ROM.

Ribbon cable socket 144 provides a means for connecting the device card 114 socket connection (not shown in FIG. 1) to the circuit board 130.

Circuit board 130 provides a mounting structure for numerous computer devices, such as semiconductor chip 150, semiconductor chip 152, and piggyback circuit board 154. Piggyback circuit board 154 also contains numerous electronic and semiconductor devices mounted thereupon.

Ribbon cable 156 and ribbon cable 158 provide a connection for screen 110, keyboard 106, and pointing controller 108 to connect with circuit board 130. Ribbon cables 156 and 158 are flexible so that upper shroud 104 can be lifted away from lower shroud 102 for access to service internal parts of the computer.

Figure 2:
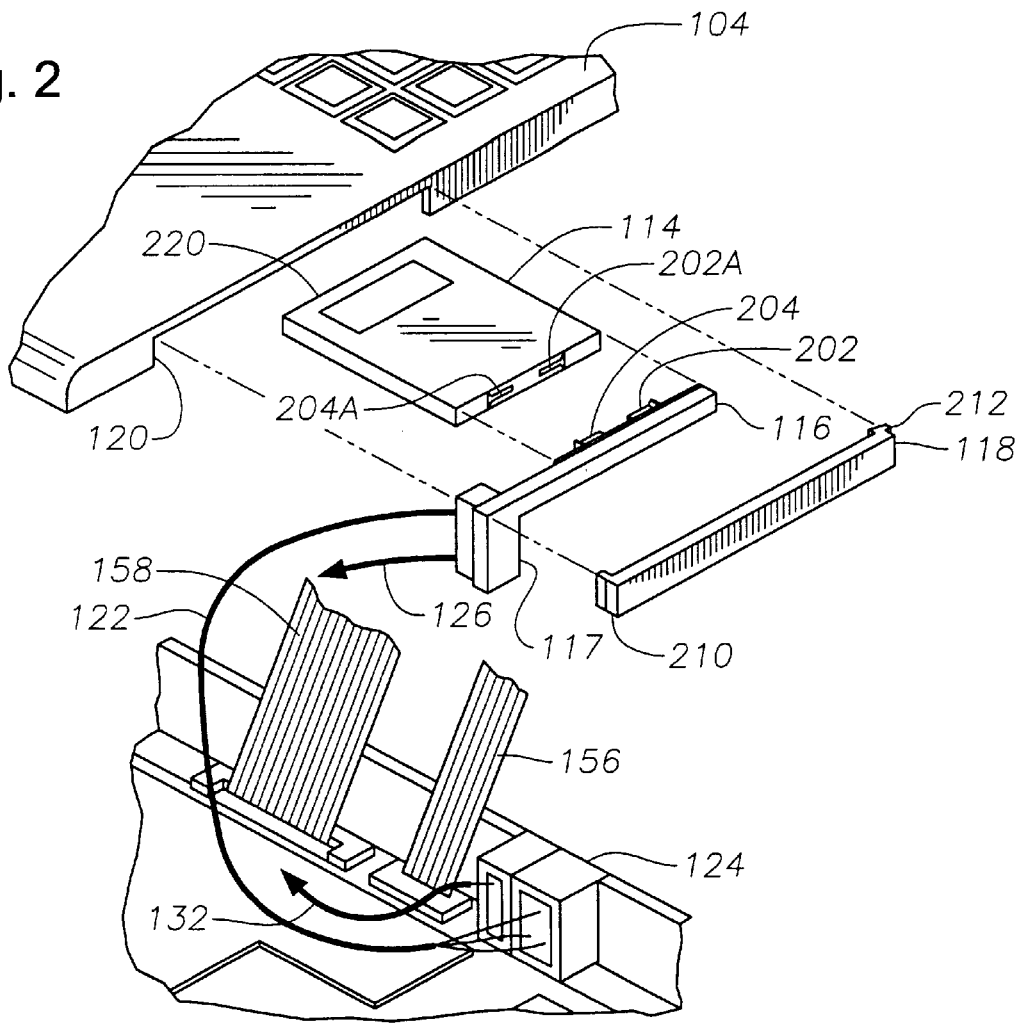
FIG. 2 is a detail isometric drawing of a device mounted in a computer case.

Turning now to FIG. 2, there is shown an enlarged view of device card 114, adapter 116, and cover 118. Adapter 116 has plug 202 and plug 204. Plug 202 fits into slot 202A of device card 114, while plug 204 fits into slot 204A of device card 114. Device card 114 is connected electrically to LAN signal cable 126 and telephone signal cable 122 through electrical connectors within plugs 202 and 204, as will be more fully disclosed hereinbelow.

Cover 118 has indentation 210 and hook 212. Indentation 210 and hook 212 fit into mating structures made into upper shroud 104 in order to retain cover 118 in opening 120 during normal operation of the computer.

Figure 3:
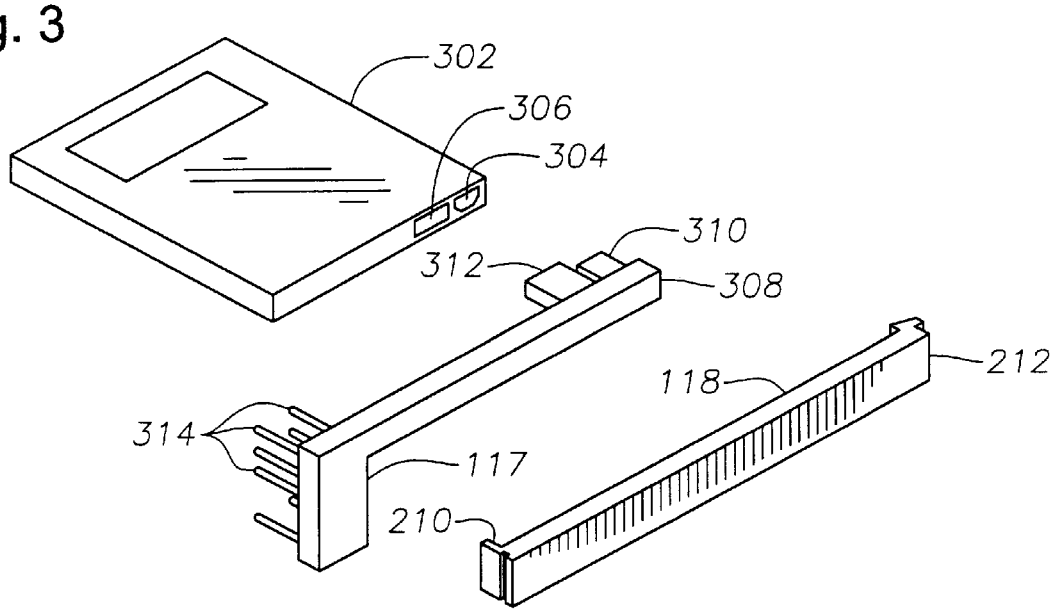
FIG. 3 is detail isometric drawing of a device and an electrical connection.

Turning now to FIG. 3, device card 302 is an alternative embodiment of device card 114. Slot 304 and slot 306 of device card 302 are shown to have a configuration which differs from that shown in device card 114. Adapter 308 is also an alternative embodiment of adapter 116, and differs from adapter 116 in the placement of plugs 310 and 312.

Plug 310 connects electrically into slot 304. Plug 312 connects electrically into slot 306.

Adapter 308 has pins 314. Pins 314 provide a male connection to a plug (not shown) to telephone signal cable 122 and to LAN signal cable 126.

Cover 316 is shown having the same embodiment in FIG. 3 as shown in FIG. 1 and FIG. 2 as cover 118. The molded structures at the ends 320 and 322 of cover 316 interoperate with mating structures molded into upper shroud 104 in order to close opening 120 during normal operation of computer 100.

Figure 4:
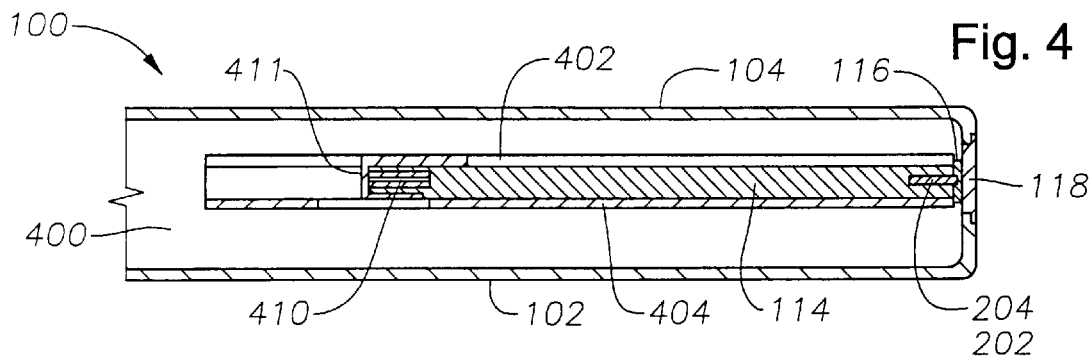
FIG. 4 is a cross sectional drawing of a device mounted in a computer case.

Turning now to FIG. 4, there is shown a cross-sectional drawing giving the location of device card 114 within computer 100. Using like numbers to indicate like parts as illustrated in FIG. 1, FIG. 2, and FIG. 3, there is shown a computer case 400 formed from upper shroud 104 and lower shroud 102. Upper socket member 402 and lower socket member 404 form a socket to retain device card 114. Pins 410 of the socket 411 interconnect, for example, with female connectors in device card 114 to provide a connection from device card 114 to ribbon cable socket 144. Alternatively, the female connectors may be in the socket and the pins in the device card. A ribbon cable (not shown) connects numerous pins 410 of device card 114 to the circuit board 130 by connection to ribbon cable socket 144.

Cover 118 is shown in place so as to block access from outside computer 100 to device card 114. Adapter 116 is shown with an edge view of plugs 204, 202 inserted into device card 114.

The arrangement for mounting upper socket member 402 and lower socket member 404 is not shown in FIG. 4, as FIG. 4 is simply illustrative of the mounting of the socket members 402, 404 within the computer case formed by upper shroud 104 and lower shroud 102.

In an illustrative embodiment shown hereinbelow, upper socket member 402 is the lower, inner, surface of upper shroud 104.

Figure 5:
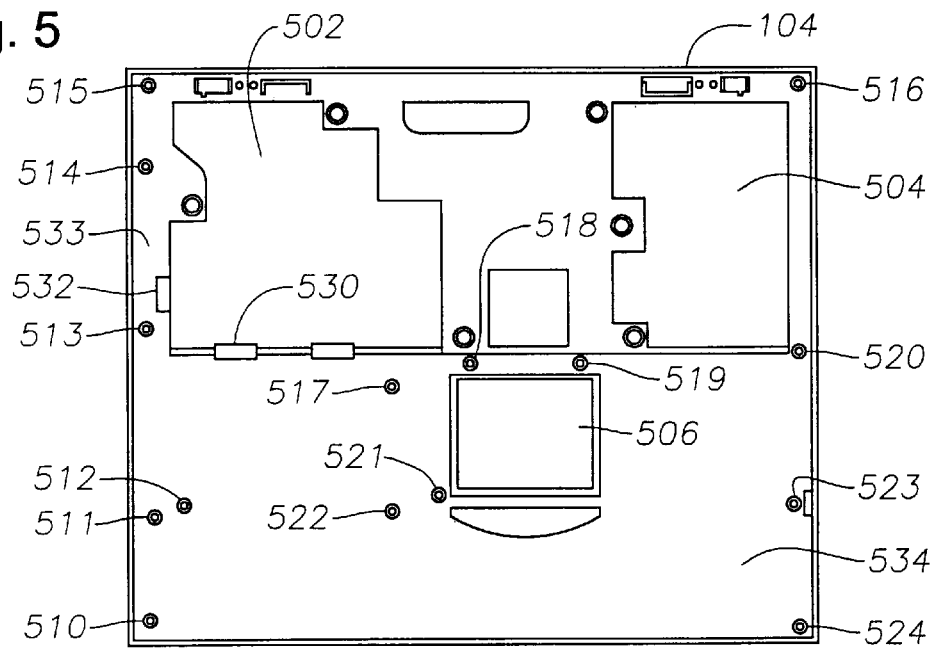
FIG. 5 is a view of the underside of an upper shroud of a computer case.

Turning now to FIG. 5, there is shown the under side of an upper shroud 104. Several of the screw studs 510 through 524 contact an inner surface (not shown) of lower shroud 102, and match with mating holes (not shown) in the bottom (not shown) of lower shroud 102. Machine screws having their heads below a bottom (not shown) of lower shroud 102 are screwed into screw studs 510, 512, 515, 516, 520, and 524 in order to secure upper shroud 104 to lower shroud 102. When upper shroud 104 is secured to lower shroud 102, the two shrouds form a case for the computer.

Openings 502, 504 facilitate mounting keyboard 106. Opening 506 facilitates mounting a pointing device such as a track ball, etc. Tab 530 aids in locking a socket (not shown in FIG. 5, shown in FIG. 6) against first horizontal motion and vertical motion. Also post 532 aids in locking the same socket against second horizontal motion.

Other screw studs, including for example, 516, 517, 519, 522, 523, etc. are used to hold screws attaching parts to the under surface 534 of upper shroud 104.

In an exemplary embodiment of the invention, upper shroud 104 is made of molded plastic, and screw studs 510 through screw stud 524 are permanently attached into the plastic material of upper shroud 104.

Tab 530 assists in securing a socket (not shown in FIG. 5) for device card 114, as will be more fully disclosed hereinbelow.

Figure 6:
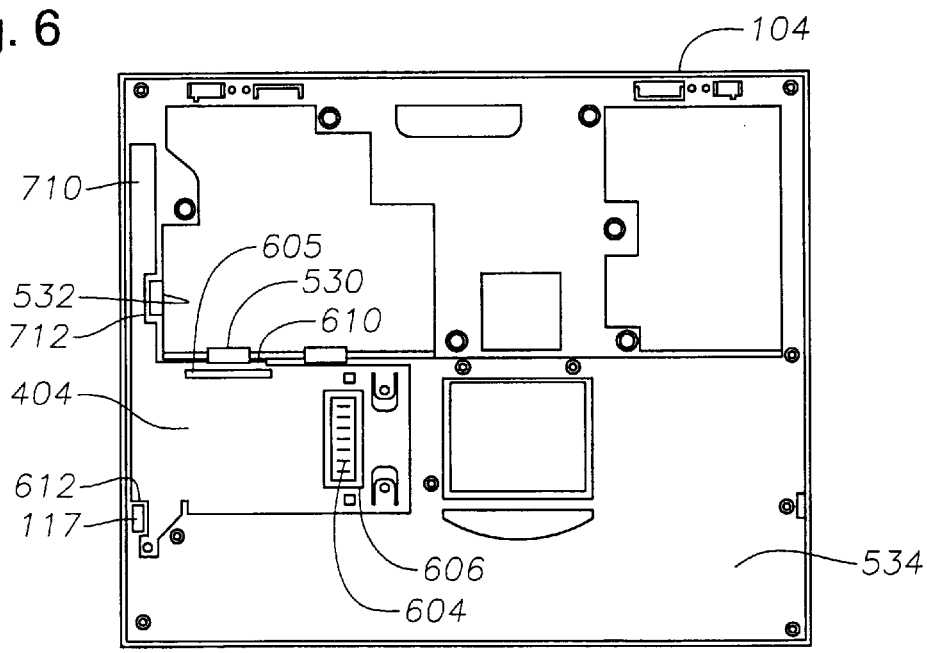
FIG. 6 is the view of FIG. 6 with a socket mounted on the underside of the upper shroud of the computer case.

Turning now to FIG. 6, there is shown an underside view of upper shroud 104, as shown in FIG. 5, however with a lower socket member 404 mounted thereon. In an exemplary embodiment of the invention, lower socket member 404 is a stamped sheet metal part. Lower socket member 404 is attached by threaded machine screws (not shown) screwed into screw stud 517, screw stud 522, screw stud 511, screw stud 513, and screw stud 514.

A lower view of a connector portion 604 of a socket frame assembly (not shown in FIG. 6) is shown through opening 606 of lower socket member 404. Connector portion 604 will be more fully described hereinbelow. Connector portion 604 attaches electrically to a ribbon cable (not shown in FIG. 6), and the ribbon cable plugs into ribbon cable socket 144, as will be more fully described hereinbelow.

Tab 610 of lower socket member 602 fits beneath tab 530 of upper shroud 104 in order to help secure lower socket member 602 to the underside 534 of upper shroud 104.

Socket 117 of adapter 116 is shown in position at surface 612 of lower socket member 404.

Figure 7:
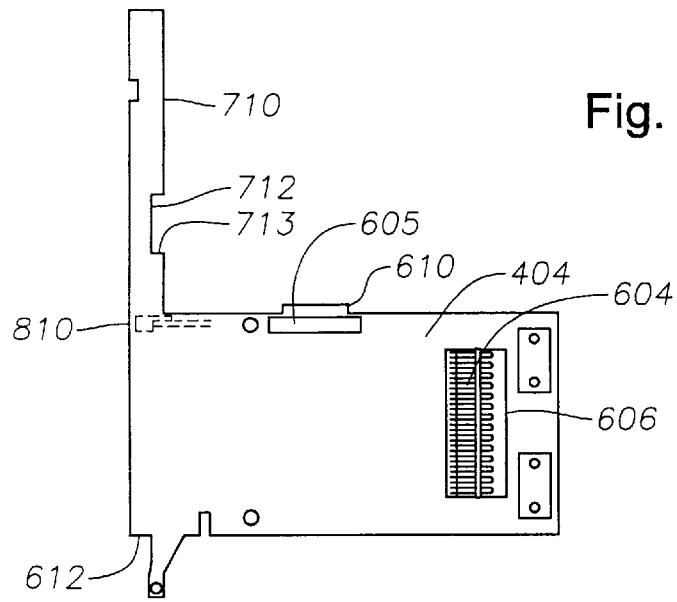
FIG. 7 is socket viewed from below.

Turning now to FIG. 7, lower socket member 404 is shown. Tab 610 is shown. In an exemplary embodiment of the invention, tab 610 is stamped from the sheet metal blank from which lower socket member 404 is stamped, and is taken from an opening 605 which is formed in the stamping process. Arm 710 fits in a thin channel 533 of upper shroud 104, and serves to strengthen the thin shroud structure at channel 533 (as shown in FIG. 5 and FIG. 6). Notch 712 fits around post 532 in order to aid lower socket member 404 to resist horizontal motion. Surface 713 rests against post 532, and in an alternative embodiment of the invention only surface 713 is used to interact with post 532 for lower socket member 404 to resist horizontal motion.

Connector portion 604 of a socket frame assembly (not shown in FIG. 7) is shown in opening 606 of lower socket member 404.

Plunger 810 is shown in dashed line as it is below the near surface of lower socket member 404, in order to provide orientation for FIG. 8. However, the detail of socket frame assembly 802 is not shown in FIG. 7.

Figure 8:
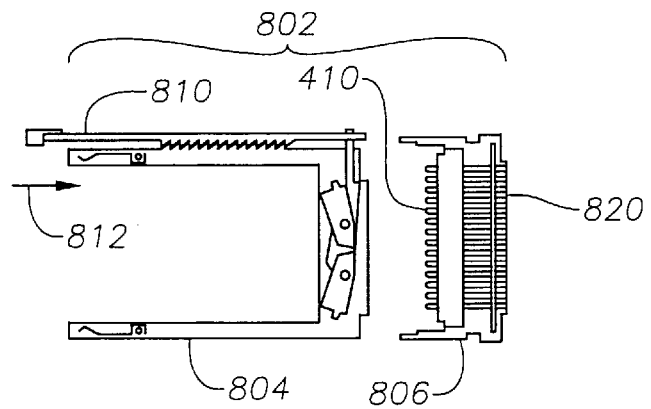
FIG. 8 is a socket frame assembly.

Turning now to FIG. 8, there is shown a socket frame assembly 802. Socket frame assembly 802 is made up of two parts, a guide frame 804 and a connector portion 806. A part of connector portion 806 is shown in FIG. 6 and FIG. 7 as connector portion 604. The socket frame assembly 802 is oriented in FIG. 8 as shown in FIG. 6 and FIG. 7, with the lower socket member 404 simply removed. Also, in FIG. 8, the connector portion 806 is disassembled from the guide frame 804.

Plunger 810 is depressed in the direction of arrow 812 in order to release device card 114 (not shown in FIG. 8) from the guide frame 804, as will be more fully described hereinbelow.

Electrical pins 410 are connected to electrical tabs 820 as is more fully disclosed in FIG. 13, and electrical pins 410 connect into mating electrical connectors in device card 114. Electrical tabs 820 connect to a ribbon cable. The ribbon cable connects to ribbon cable socket 144 in order to connect device card 114 to the circuit board 130 (as will be more fully disclosed with reference to FIG. 12 and FIG. 13).

Figure 9:
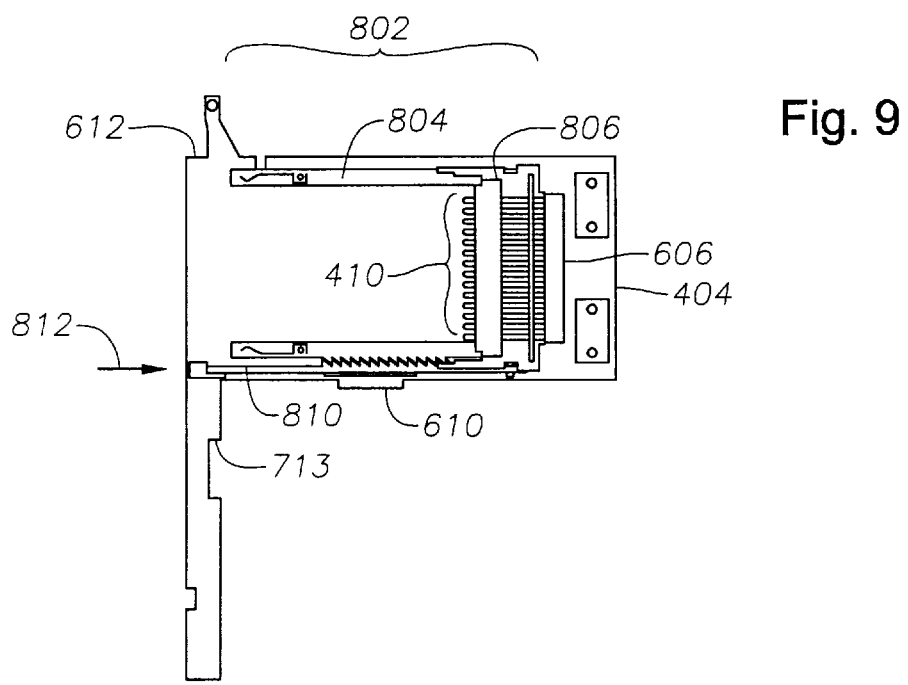
FIG. 9 is a socket frame assembly viewed from above.

Turning now to FIG. 9, there is shown an upper view of the lower socket member 404 and the socket frame assembly 802. Socket frame assembly 802 is shown with guide frame 804 and connector portion 806 in assembled relationship, rather than in dis-assembled relationship shown in FIG. 8.

Also, socket frame assembly 802 is shown in place within a cavity formed in lower socket member 404. As shown, plunger 810 is accessible from outside the computer case, so that with a tool such as a pencil, plunger 810 can be moved in the direction of arrow 812 in order to release device card 114 from guide frame 804.

Referring now to FIG. 4, upper socket member 402 is formed by lower surface 534 (as shown in FIG. 5) of upper shroud 104.

Figure 10:
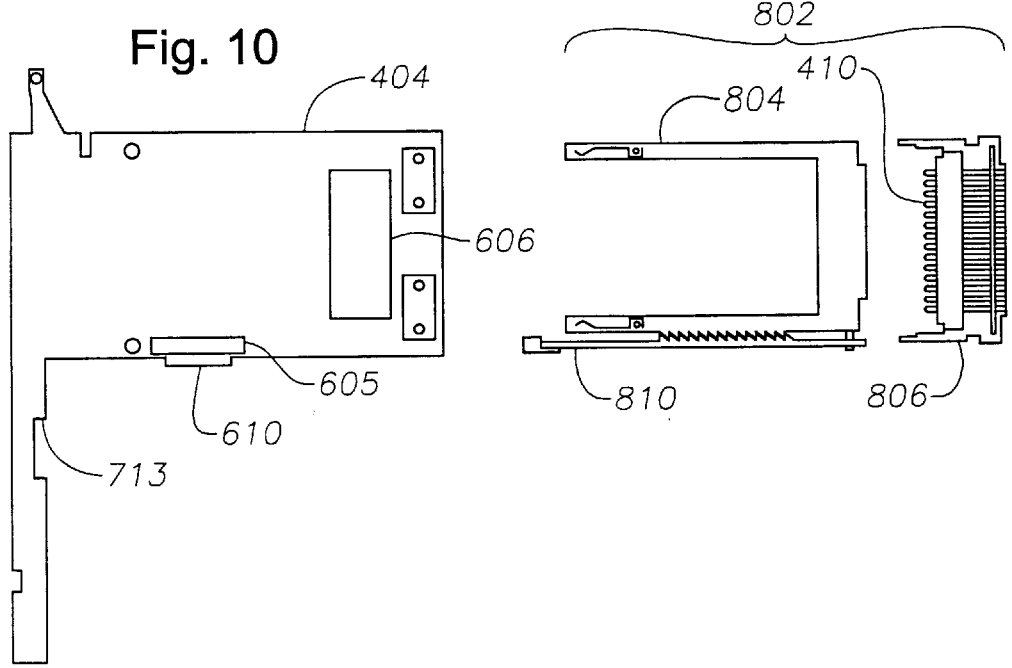
FIG. 10 is a socket frame assembly viewed from above in an assembly view.

Turning now to FIG. 10, there is shown lower socket member 404 in the orientation of FIG. 9, and also socket frame assembly 802 in disassembled relationship. Guide frame 804 is shown disassembled from connector portion 806. FIG. 10 is a view from above upper shroud 104, while FIG. 8 is a view from below upper shroud 104 Contact pins 410 insert into inner end 220 of device card 114 as shown in FIG. 2. In an alternative embodiment of the invention, a standard device card 114 known as a PCMCIA Standard has pins 410 forming a double layer of electrically conductive pins. Pins 410 connect to electrical tabs 820, as shown in FIG. 8. Note that in FIG. 8 a side of connector portion 806 facing the circuit board 130 is shown, and in FIG. 10 the electrical pins 410 are hidden from view in FIG. 6 by lower socket member 404. See FIG. 13 for a more detailed view of connector portion 806.

Figure 11:
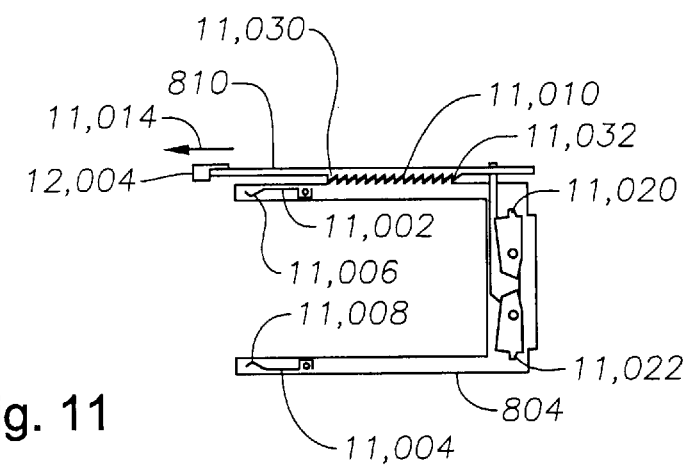
FIG. 11 is guide frame.
Figure 12:
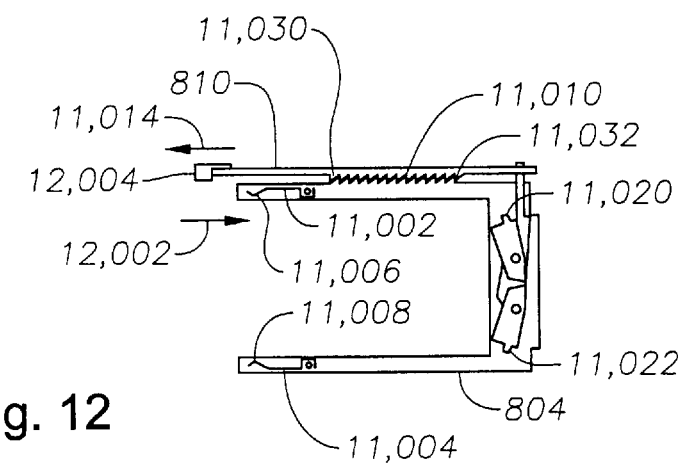
FIG. 12 is the guide frame of FIG. 11 with ejection pads in eject position.

Turning now to FIG. 11 and FIG. 12, operation of an eject mechanism for the purpose of ejecting device card 114 from the guide frame 804 is shown.

The eject mechanism of the guide frame 804 is shown in FIG. 11 and FIG. 12. Referring now to FIG. 11, flat springs 11,002 and 11,004 press against sides 222 and 224 of device card 114. In an exemplary embodiment of the invention, small indentations (not shown) in the sides 222, 224 of device card 114 (as shown in FIG. 2) mate with point 11,006 of spring 11,002 and point 11,008 of flat spring 11,004. Coil spring 11,010 urges plunger 810 in the direction shown by arrow 11,014. Coil spring 11,010 is anchored to guide frame 804 at end 11,030, and is attached to plunger 11,012 at end 11,032.

Plunger 810 is mechanically linked to pressure pad 11,020 and pressure pad 11,022. Pressure pad 11,020 and pressure pad 11,022 stand vertically, perpendicular to the plane of FIG. 11 and FIG. 12, and contact the inner end 220 of device card 114. Device card 114 normally rests with end 220 in contact with pressure pad 11,020 and pressure pad 11,022. Further, device card 114 is normally held in position with end 220 against pressure pads 11,020 and 11,022 by pins 410 shown in FIG. 10 being inserted into sockets formed in end 220 of device card 114, and also by springs 11,002 and 11,004 pressing against the sides of device card 114.

Turning now to FIG. 12, plunger 810 is shown depressed in the direction shown by arrow 12,002. Mechanical linkage with pressure pads 11,020 and 11,022 causes the pressure pads to move forward as plunger 810 is depressed in the direction shown by arrow 12,002, as shown in FIG. 12. Motion of pressure pads 11,020 and 11,022 force device card 114 forward, and release device card 114 from retention by guide frame 804. Upon depression of plunger 810 by the application of pressure against end 12,004, the device card 114 is ejected from guide frame 804.

Turning now to FIG. 13A, a more detailed view of connector portion 806 is shown in a cutaway view. Connector tabs 820 shown in FIG. 8 are substantially planar for ease of connection to ribbon cable 19,002 shown in FIG. 19. Pins 410 are a double row of pins for insertion into end 220 of device card 114. The double row of pins 410 connect to the substantially planar connection tabs 820 by metal leads passing through plastic mounting block 13,002.

Turning now to FIG. 13B, there is shown a 68 pin interconnect for the inner end of device card 114. In this exemplary embodiment there are 34 pins in each row of pins 410 shown in FIG. 13A. The 68 pin interconnect shown in FIG. 13B is more fully described in the book "PCMCIA System Architecture", author Don Anderson, published by Mind Share, Inc. and Addison Wesley, Copyright 1995, all disclosures of which are incorporated by reference hereinabove.

Turning now to FIG. 14A, there is shown a front isometric view of an exemplary embodiment of an adapter 116. Adapter 116 is assembled from several parts, as disclosed more fully hereinbelow. Plug 14,002 and plug 14,004 provide female receptacles for pins contained within slots 202A and 204A (as shown in FIG. 2) of device card 114 (the pins within slots 202A and 204A of device card 114 are not shown). Socket 14,006 provides male pins 14,007 for connection to a female plug (not shown) carrying telephone signal cable 122 and LAN signal cable 126.

FIG. 14B shows a rear isometric view of adapter 116. Insulating structure 14,010 and insulating structure 14,012 are shown. Insulating structures 14,010 and 14,012 serve to protect the otherwise exposed electrical connections of plugs 14,002, 14,004, and socket 14,006.

Turning now to FIG. 14C, a front view of the exemplary embodiment of adapter 116 is shown. Sockets 14,002 and 14,004 are shown with female connectors 14,022 and 14,024. Various of the female connectors of plugs 14,002 and 14,004 are connected to pins 14,007 of socket 14,006, as will be more fully disclosed hereinbelow.

Figure 15:
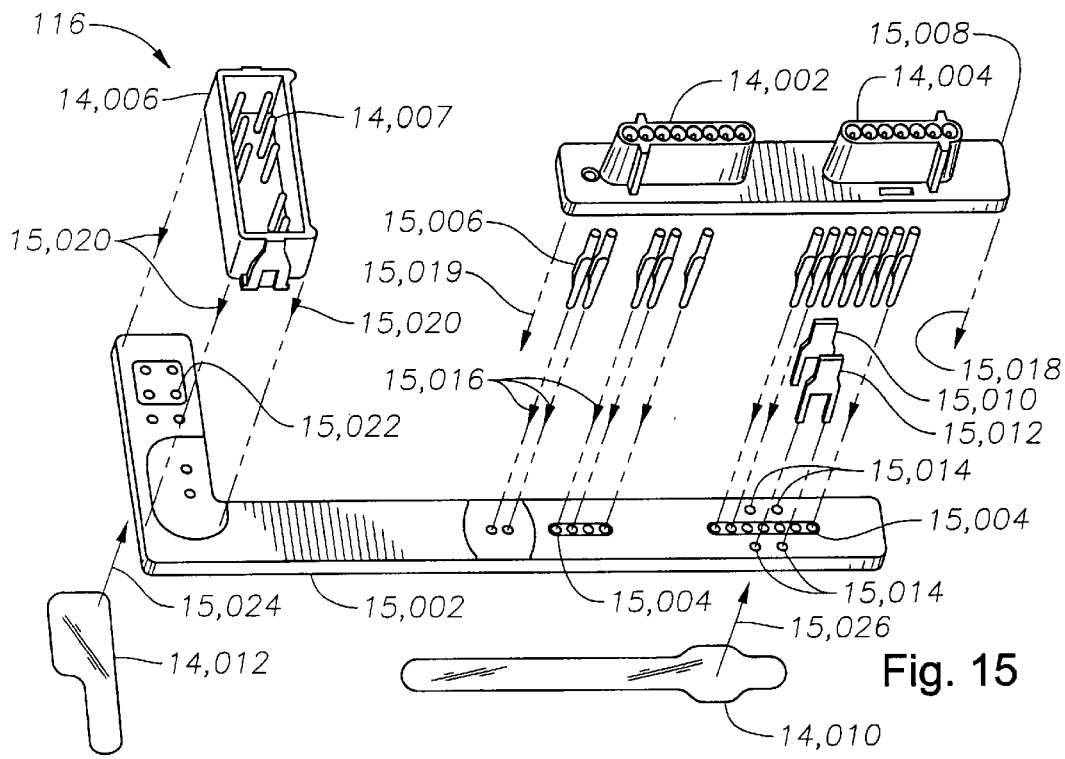
FIG. 15 is a front assembly view of an adapter.

Turning now to FIG. 15, there is shown circuit card 15,002 of adapter 116. Circuit card 15,002 has holes 15,004 to receive female connectors 15,006. Female connectors 15,006 fit into matching openings within plugs 14,002 and 14,004. Plugs 14,002 and 14,004 are mounted on circuit card 15,008. Circuit card 15,008 is, in turn, mounted on circuit card 15,002. Guides 15,010 and 15,012 fit into holes 15,014 of circuit card 15,002. There are four holes 15,014, as shown, to receive the mating pins of guides 15,010 and 15,012. Pins 15,006 insert into their respective holes 15,004 as shown by arrows 15,016. Arrows 15,018 and 15,019 show the direction of assembly of circuit card 15,008 onto circuit card 15,002, when the pins 15,006 are inserted into their mating holes 15,014, and also the pins are inserted into the mating openings therefor in plugs 14,002 and 14,004.

Socket 14,006 is shown by arrows 15,020 to fit onto circuit card 15,002 such that pins 14,007 insert into matching holes 15,022 of circuit card 15,002. Insulating structure 14,012 is shown by arrow 15,024 to attach to the hidden side of circuit card 15,002. Also insulating structure 14,010 is shown by arrow 15,026 to attach to the hidden side of circuit card 15,002. FIG. 14B shows insulating structure 14,012 and 14,010 assembled onto circuit card 15,002.

Figure 16:
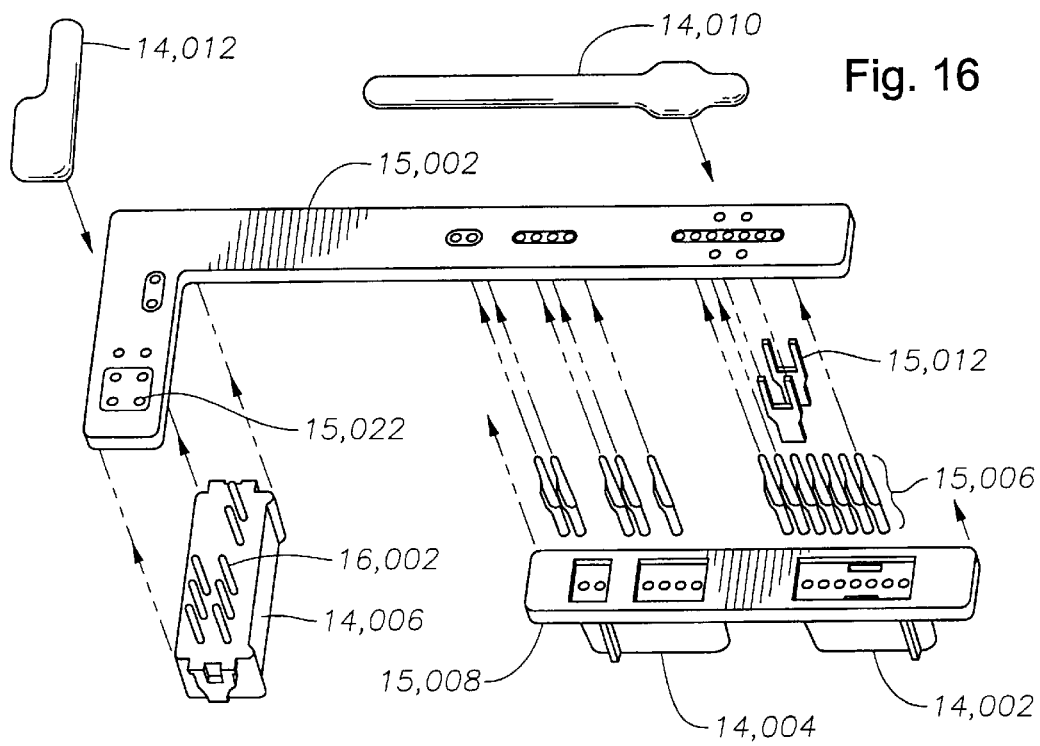
FIG. 16 is a rear assembly view of the adapter of FIG. 15.

Turning now to FIG. 16, a rear assembly drawing of an exemplary embodiment of adapter 116 as shown in FIG. 15 is shown. Pins 16,002 are shown protruding from the rear of socket 14,006. The protruding pins 16,002 fit into their matching holes 15,022 formed in circuit card 15,002.

Figure 17A:
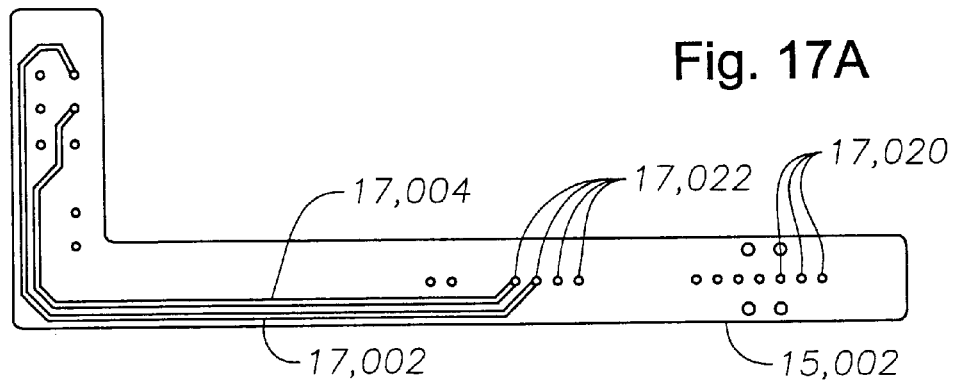
FIG. 17A and FIG. 17B are layout diagrams of traces on a circuit board of an adapter.

Turning now to FIG. 17A, conductive traces 17,002 and 17,004, formed in circuit card 15,002 are shown. In an illustrative embodiment of the invention, conductive traces 17,002 and 17,004 provide, for example, a transmit pair for an Ethernet connection through adapter 116, and between circuit board 130 and device card 114.

Figure 17B:
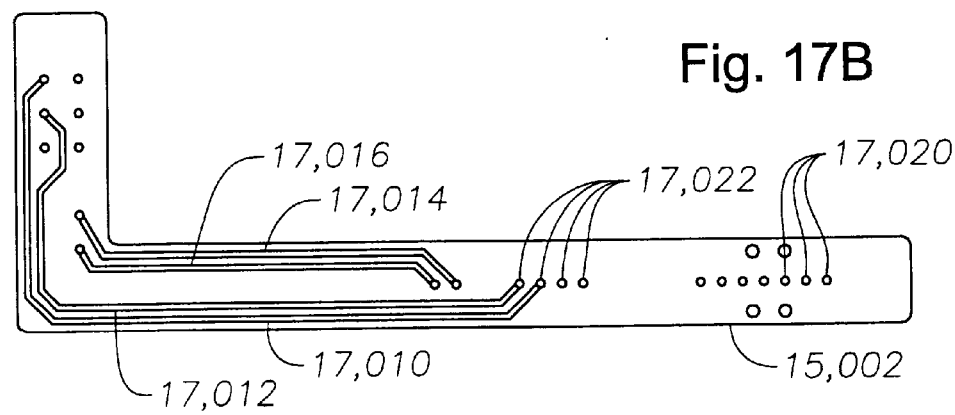

Turning now to FIG. 17B, conductive traces 17,010, 17,012, 17,014, and 17,016 are shown as formed in circuit card 15,002 of adapter 116. Conductive traces 17,010 and 17,012 provide, for example, an Ethernet receive pair connection through adapter 116, and between circuit board 130 and device card 114.

Conductive traces 17,014 and 17,016 provide, for example, a telephone line connection between circuit board 130 and device card 114 for operation of a modem portion of device card 114.

As shown in FIGS. 17A and FIGS. 17B, holes 17,020 are for plug 14,004 and holes 17,022 are for plug 14,002. In the exemplary embodiment of the invention shown in FIG. 17A and FIG. 17B, only plug 14,002 has electrical connections thereto in adapter 116. Plug 14,004, with corresponding holes 17,020, is held in reserve for future expansion of the capability of commercial device cards 114.

Figure 18A:
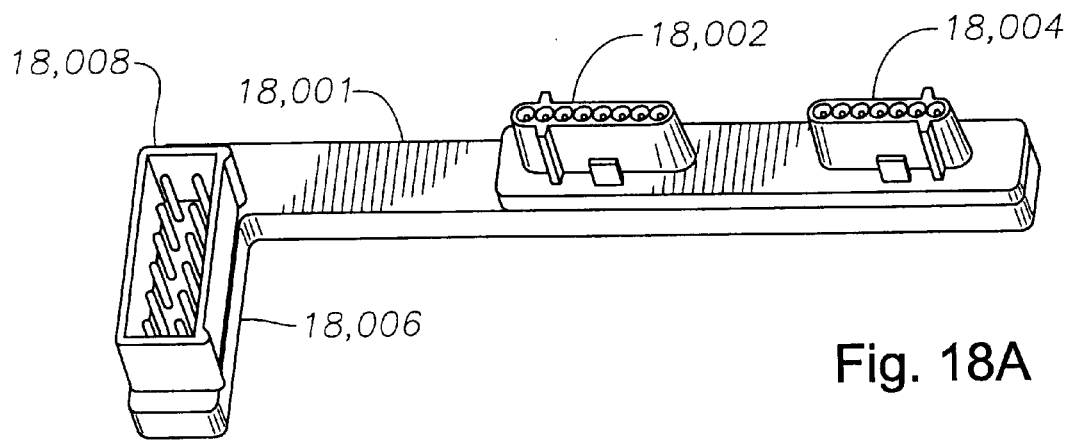
FIG. 18A, FIG. 18B, FIG. 18C, FIG. 18D, and FIG. 18E are various views of an alternative embodiment of an adapter.
Figure 18B:
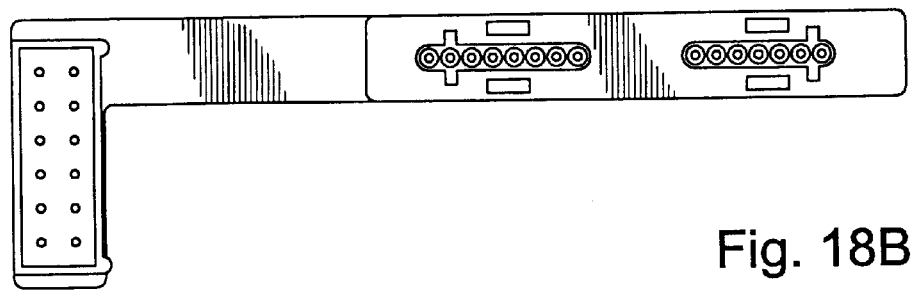
Figure 18C:
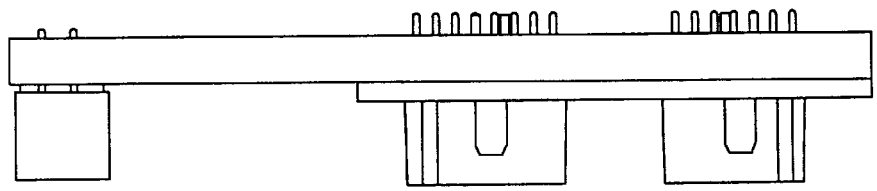
Figure 18D:
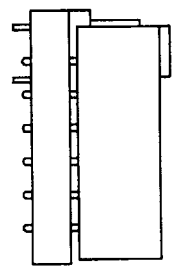
Figure 18E:
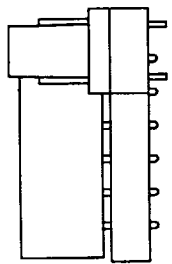

Turning now to FIG. 18A through FIG. 18E, there is shown an alternative embodiment of the adapter 116. As shown in FIG. 18A, long member 18,001 of adapter 116 has plug 18,002 and plug 18,004 mounted thereupon. Socket 18,008 is mounted on short member 18,006. Short member 18,006 is mounted in reverse to the mounting of socket 14,006 as shown in FIG. 14A. The exemplary embodiment of the adapter 116 shown in FIG. 18A is convenient for use in a computer wherein the socket for device card 114 is placed near an upper surface of lower shroud 102, rather than as is shown in FIG. 1 where the socket is placed near a lower surface of an upper shroud 104.

Figure 19:
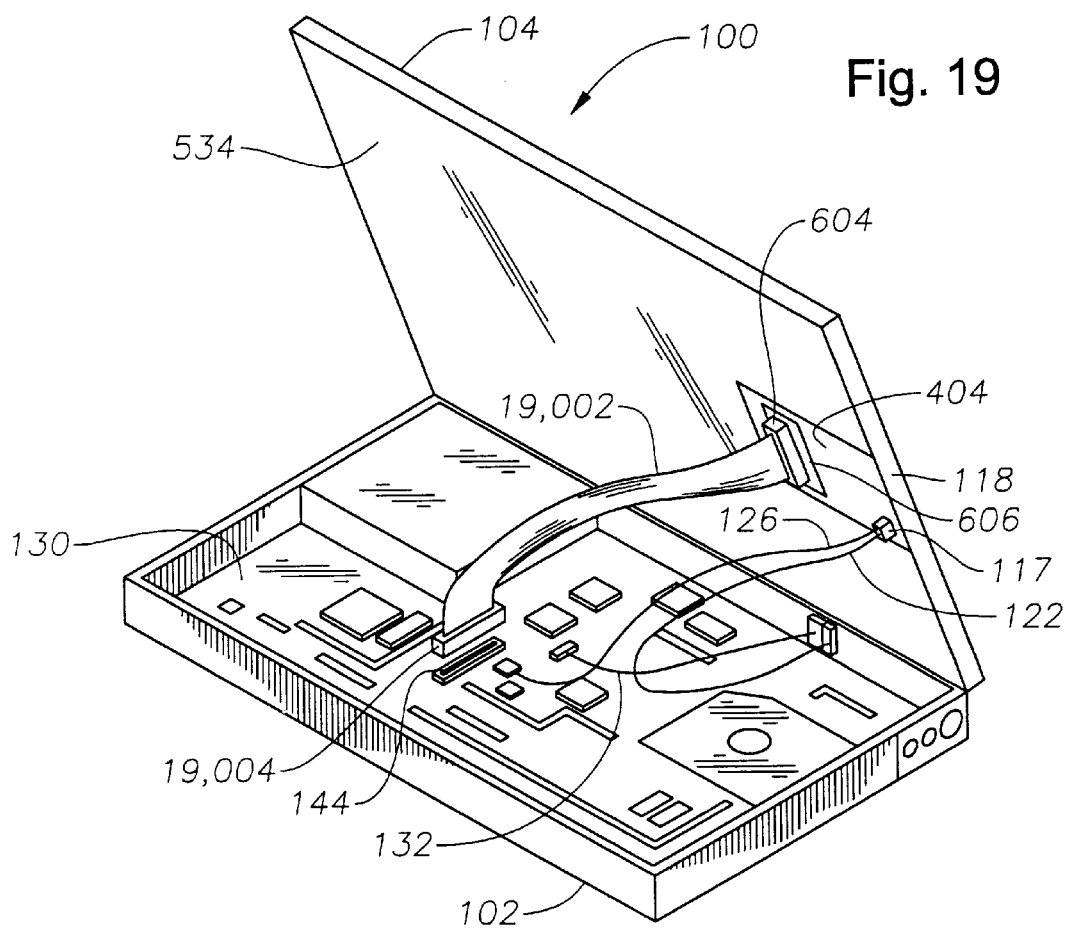
FIG. 19 is an interior view of a computer showing an inner (lower) surface of an upper shroud.

Turning now to FIG. 19, there is shown computer 100 with upper shroud 104 and lower shroud 102. Upper shroud 104 is in an open position such that lower surface 534 of upper shroud 104 is visible. Lower socket member 404 is shown, along with connector portion 604 showing through opening 606 of the lower socket member 404. Circuit board 130 is shown in lower shroud 102, along with ribbon cable socket 144. A first end of ribbon cable 19,002 connects to connector portion 604 electrical connector tabs 820 (not shown in FIG. 19). A second end of ribbon cable 19,002 connects to plug 19,004. Plug 19,004 makes electrical connection into ribbon cable socket 144. Accordingly, ribbon cable 19,002 carries electrical connections between circuit board 130, through ribbon cable socket 144, through ribbon cable 19,002, and into device card 114. Circuit board 130 is connected, through ribbon cable 19,002 and ribbon cable socket 144 to the pins 410, where pins 410 make connections to the exemplary 68 pin connection illustrated in FIG. 13B of device card 114.

Cover 118, as shown in FIG. 19, closes the computer case formed by upper shroud 104 and lower shroud 102. Socket 117, telephone signal cable 122, and LAN signal cable 126 are contained within the computer case formed by upper shroud 104 and lower shroud 102.

Figure 20:
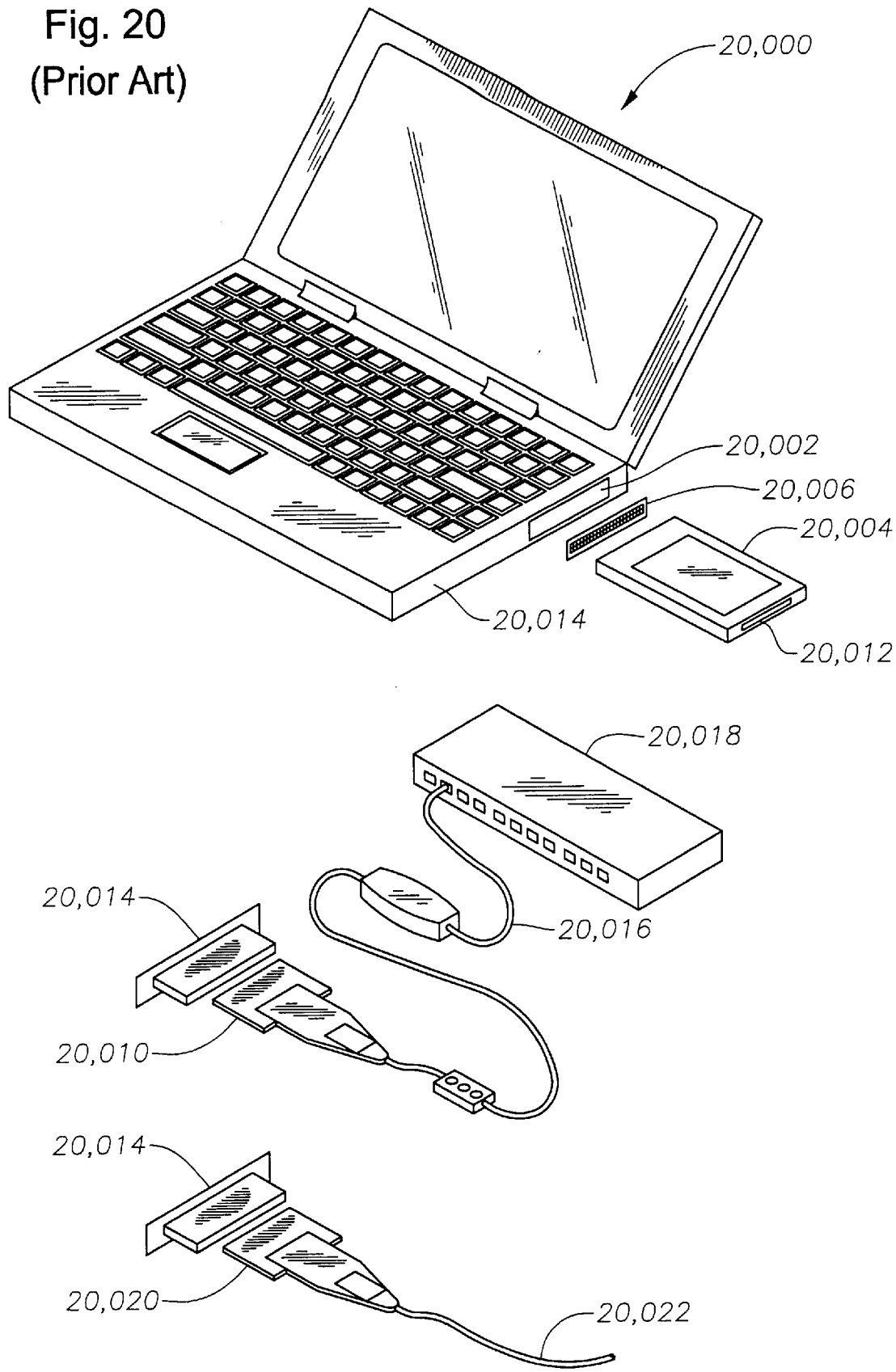
FIG. 20 shows prior art.

Turning now to FIG. 20, a prior art arrangement is shown. Computer 20,000 is shown as a laptop type computer. Slot 20,002 in computer 20,000 provides access for a PCMCIA card 20,004. Pins 20,006 are shown schematically, and represent pins at the internal end of a socket designed to accept a PCMCIA card 20,004, for example the 68 pin connection illustrated in FIG. 13B.

Pigtail connector 20,010 inserts into a socket 20,012 in PCMCIA card 20,004. Pigtail connector 20,010 extends from side 20,014 of computer 20,000. Lead 20,016 from pigtail connector 20,010 connects in turn to Ethernet network box 20,018. For example, Ethernet network box 20,018 may be an Ethernet repeater, or alternatively may be an Ethernet hub.

In an alternative embodiment of the prior art, pigtail connector 20,020 connects into slot 20,012 in PCMCIA card 20,004. Pigtail connector 20,020 connects to a telephone connection line 20,022. In the alternative embodiment represented by pigtail connector 20,020, the PCMCIA card 20,004 is a telephone modem, and line 20,022, along with pigtail connector 20,020 connects the PCMCIA card 20,004 with a telephone local loop connection.

Figure 21:
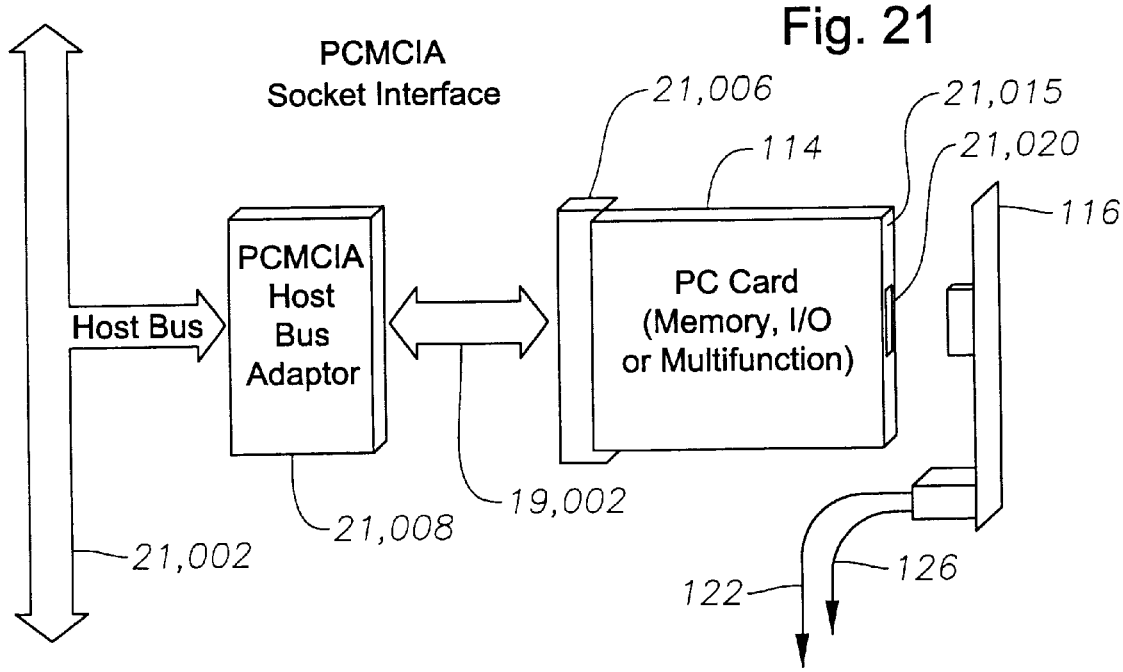
FIG. 21 is a hardware architecture drawing of a PCMCIA card connected to a computer.

Turning now to FIG. 21, there is shown a hardware architecture drawing of a PCMCIA card connected to a bus 21,002 of a computer, and with an internal adapter 116. Connection path 21,004 is completed by ribbon cable 19,002 shown in FIG. 19. Computer bus 21,002 and PCMCIA host bus adapter 21,008 are mounted to circuit board 130, but are not shown in the drawings. Socket 21,006 is an abstraction of connector 806. PC card 114 is a PCMCIA card, and is an exemplary embodiment of device card 114.

Adapter 116 provides an internal connection for electrical connections made through socket 21,020 in the outer end 21,015 of PCMCIA card 114. For example, a telephone connection may be carried internally to the case of the computer by line 122, and also a LAN connection may be carried on line 126, also internally to the case of the computer.

Figure 22:
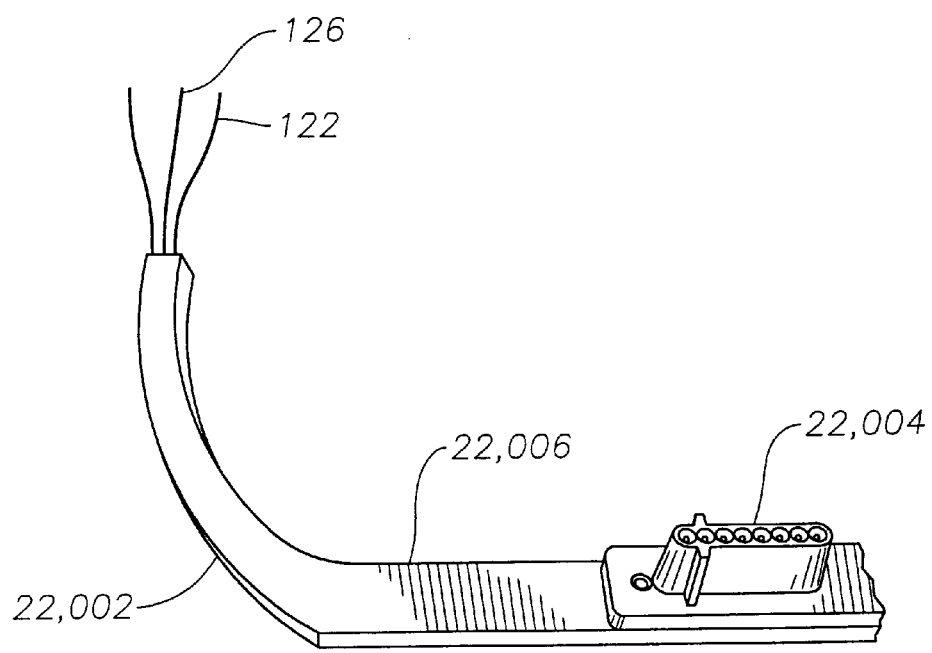
FIG. 22 is an adapter and signal wire molded as a single part.

Turning now to FIG. 22, there is shown a molded adapter 22,002. Plug 22,002 is mounted on arm 22,006 of molded adapter 22,002. Telephone signal cable 122 and LAN signal cable 126 are molded integrally with arm 22,006 of molded adapter 22,002. When used in an alternative embodiment of the invention, molded adapter 22,002 fits entirely within the case of the computer, as shown in FIG. 1, FIG. 2, FIG. 3, and FIG. 4 where the molded adapter 22,002 simply replaces the adapter 116.

It is to be understood that the above described embodiments are simply illustrative of the principles of the invention. Various other modifications and changes may be made by those skilled in the art which will embody the principles of the invention and fall within the spirit and scope thereof.

What is claimed is:

1. A computer system, comprising:
    a computer case having:
        an externally accessible connector configurable to connect to an external communications link; and
        a portion defining an opening adapted for insertion of a hardware card, whereby a first connector on a first end of the hardware card is coupled to a computer bus;
    a cover configured to cover the opening during normal operation of the computer;
    a moveable adapter which is externally accessible via the opening, wherein the adapter is coupled to the externally accessible connector, and wherein the adapter is configurable to connect to a second connector on an end of the hardware card opposite the first connector; and
    wherein the adapter includes:
        an L-shaped circuit card having a short member and a long member;
        a signal cable connector mounted on the short member and configured to electrically connect to a signal cable for coupling to the externally accessible connector; and
        a hardware card connector mounted on the long member and configured to electrically connect to said second connector on the hardware card.

2. The computer system of claim 1, wherein said adapter is configured to fit between the hardware card and the cover when the opening is covered.

3. The computer system of claim 1, wherein the external communications link is a local area network (LAN) connection.

4. The computer system of claim 1, wherein the external communications link is a telephone circuit.

5. The computer system of claim 1, wherein said adapter is attached to the externally accessible connector by a signal cable.

6. The computer system of claim 1, wherein said computer case also has a second externally accessible connector configurable to connect to a second external communications link, and wherein the adapter is coupled to both externally accessible connectors.

7. The computer system of claim 1, wherein said cover is detachable.

8. The computer system of claim 1, wherein said adapter includes:
    a circuit card;
    a signal cable connector mounted on the circuit card and configured to electrically connect to a signal cable for coupling to the externally accessible connector; and
    a hardware card connector mounted on the circuit card and configured to electrically connect to said second connector on the hardware card,
    wherein the circuit card includes conductive traces electrically coupling the signal cable connector to the hardware card connector.

9. A method for coupling an internally mounted hardware card to an external communications link, wherein the method comprises:
    providing an externally accessible communications jack in a computer case;
    providing a card socket with a first end and a second end opposite the first end, wherein the second end is adjacent to a card-insertion opening in the computer case;
    providing a bus connector at the first end of the card socket, wherein the bus connector is configured to electrically connect to a first connector on one edge of a hardware card inserted in the card socket;
    providing a moveable adapter at the second end of the card socket, the adapter including an L-shaped circuit card having a short member and a long member, wherein the adapter is internally coupled by a signal cable to the communications jack through a signal cable connector mounted on the short member, wherein the adapter includes a hardware card connector mounted on the long member, the adapter configurable to electrically connect to a second connector on a second edge of the hardware card inserted in the card socket, wherein the second edge is opposite the first edge; and
    providing a moveable cover over the card-insertion opening in the computer case to cover the opening during normal operation of the computer.

10. The method of claim 9, further comprising:
    providing a second externally accessible communications jack in a computer case, wherein the adapter is internally coupled to both communications jacks.

11. The method of claim 9, further comprising:
    opening the cover to expose the adapter;
    moving the adapter to expose the card socket;
    inserting the hardware card in the card socket so that the first connector on the hardware card mates with the bus connector;

attaching the adapter to the second connector on the hardware card; and closing the cover.

12. The method of claim 11, further comprising:

plugging a phone line into the communications jack.

13. The method of claim 11, further comprising:

plugging a LAN connection into the communications jack.

14. The method of claim 9, wherein said cover is detachable.

15. A method for coupling an internally mounted hardware card to an external communications link, wherein the method comprises:

opening a cover to expose an adapter which is internally coupled to an externally accessible communications jack, wherein the adapter includes:
an L-shaped circuit card having a short member and a long member;
a signal cable connector mounted on the short member and configured to electrically connect to a signal cable for coupling to the externally accessible connector; and
a hardware card connector mounted on the long member and configured to electrically connect to said second connector on the hardware card;

moving the adapter to expose a card socket with a first end and a second end opposite the first end, wherein the second end of the card socket is adjacent to the adapter;

inserting the hardware card in the card socket so that a first connector on the hardware card mates with a bus connector at the first end of the card socket;

attaching the adapter to a second connector on the hardware card, wherein the second connector is on an opposite end of the hardware card from the first connector; and closing the cover.

16. The method of claim 15, further comprising:

plugging a phone line into the communications jack.

17. The method of claim 15, further comprising:

plugging a LAN connection into the communications jack.

18. A computer which comprises:

a computer case having:
a first externally accessible connector configurable to connect to a local area network;
a second externally accessible connector configurable to connect to a telephone circuit; and
an opening adapted for insertion of a hardware card, whereby a first connector on a first end of the hardware card is coupled to a computer bus;

a detachable cover configured to cover said opening during normal operation of the computer;

a moveable adapter which is externally accessible via said opening, wherein the adapter is coupled to the externally accessible connectors by one or more signal cables wholly internal to the computer case, wherein the adapter is configurable to connect to a second connector on an end of the hardware card opposite the first connector, and wherein the adapter is configured to fit between the hardware card and the cover when the opening is covered; and wherein the adapter includes:
an L-shaped circuit card having a short member and a long member;
a signal cable connector mounted on the short member and configured to electrically connect to a signal cable for coupling to the externally accessible connector; and
a hardware card connector mounted on the long member and configured to electrically connect to said second connector on the hardware card,
wherein the circuit card includes conductive traces electrically coupling the signal cable connector to the hardware card connector.

* * * * *